United States Patent [19]
Hamada

[11] Patent Number: 5,267,205
[45] Date of Patent: Nov. 30, 1993

[54] SEMICONDUCTOR MEMORY DEVICE

[75] Inventor: Mitsuhiro Hamada, Tokyo, Japan

[73] Assignee: NEC Corporation, Tokyo, Japan

[21] Appl. No.: 633,845

[22] Filed: Dec. 26, 1990

[30] Foreign Application Priority Data

Dec. 25, 1989 [JP] Japan ................... 1-337436

[51] Int. Cl.[5] ............... G11C 7/00; G11C 11/40
[52] U.S. Cl. .................. 365/200; 365/189.01;
371/10.1; 371/10.2; 371/10.3
[58] Field of Search ............ 365/189.01, 200;
371/10.1, 10.2, 10.3

[56] References Cited

U.S. PATENT DOCUMENTS

| | | | |
|---|---|---|---|
| 4,567,580 | 1/1986 | Varshney ................. | 365/200 |
| 4,573,146 | 2/1986 | Graham et al. ............ | 365/200 |
| 4,984,205 | 1/1991 | Sugibayashi .............. | 365/200 |
| 5,008,857 | 4/1991 | Mizoguchi ................ | 365/200 |
| 5,124,949 | 6/1992 | Morigami ................. | 365/210 |

Primary Examiner—Eugene R. LaRoche
Assistant Examiner—Viet Q. Nguyen
Attorney, Agent, or Firm—Sughrue, Mion, Zinn, Macpeak & Seas

[57] ABSTRACT

A semiconductor memory device with a redundant configuration according to the present invention includes a roll call circuit which turns an output signal of a sense amplifier compulsorily to a signal of a predetermined logical level when a portion constituting the redundant configuration is accessed, and turns an output signal of the output control circuit to that of the same predetermined logical level when a write instruction is given outside a normal level. Whether a spare memory cell is accessed can be checked in every output and the redundant configuration can operate with stability.

2 Claims, 4 Drawing Sheets

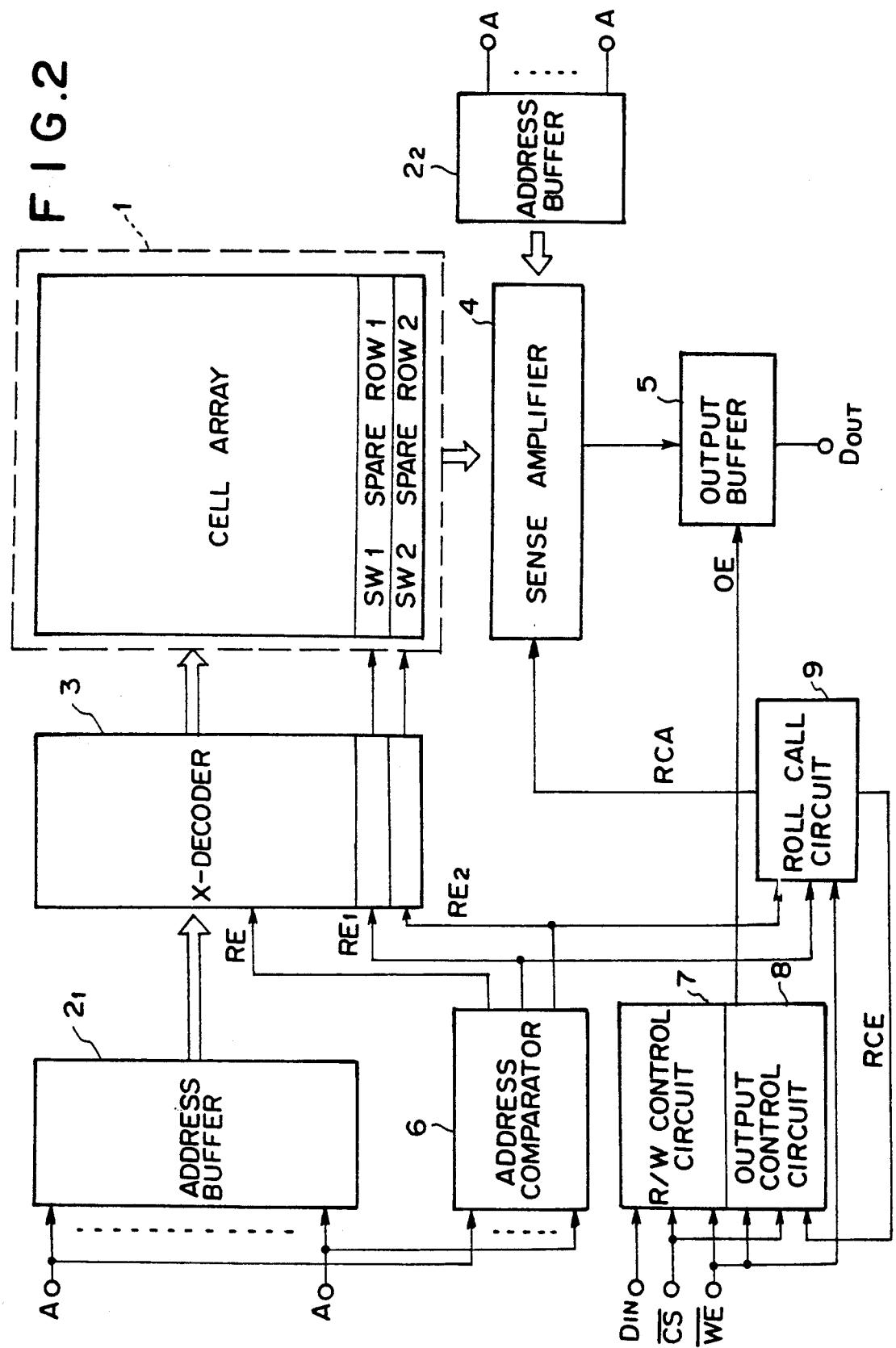

SEMICONDUCTOR MEMORY DEVICE

BACKGROUND OF THE INVENTION

The present invention relates to a semiconductor memory device and, more particularly, to a semiconductor memory device having a redundant configuration.

In order to increase an integration degree of a semiconductor memory device, it is possible to employ a redundant configuration which improves the yield rate markedly. Especially, as for a MOS memory device having a high integration degree, the redundant configuration has been adopted since the time of 64K SRAM. The integration degree in an ECL RAM has also been increased year by year and, especially in recent years, due to the advancement of Bi-CMOS technique. The adoption of a redundant configuration makes it possible to replace a row or column having a fault bit by a spare row or column, whereby a chip having a small number of fault bits can be made substantially faultless. The essentials for a redundant configuration include the above-mentioned spare row or column, an address comparator which compares the address of a fault bit with a selected address and generates a signal by which the row or column having the fault bit, if any, is left out of selection and the spare row or column is brought into a selected state, and a roll call circuit which detects the address of any fault bit.

A power supply current is small in the roll call circuit of a MOS memory device and, due to this characteristic, a small increase in the current can detect the address of a fault bit. The power supply current is increased one by one from "0" address to the final address and is measured in each address. When the address of a fault bit is detected, the address comparator operates and generates the signal, which results in an increase in the power supply current of about 1 mA. In the case of an ECL RAM, the power supply current is about 100 mA so that it is impossible to use the roll call circuit of this type which detects an address of a fault bit by detecting the increase of a power supply current. A conventional method of detecting an address of a fault bit is that of detecting the current of an input terminal. This conventional method, however, has a disadvantage in that, when a spare memory is accessed, the amount of the power supply current increase is so small that the measurement of the current is affected by the contact resistance between the input terminal and the measuring device which measures the current of the terminal resulting in measurement errors, and also in that, in the case of a memory device having a plurality of outputs, the address of a fault bit cannot be detected in every output thereof.

SUMMARY OF THE INVENTION

It is, therefore, an object of the present invention to overcome the above-mentioned problems existing in the conventional device and to provide an improved semiconductor memory device having a redundant configuration.

It is another object of the present invention to provide a semiconductor memory device which can check whether a spare memory cell is accessed so that no measurement error occurs at the time of detecting an address of a fault bit and that the redundant configuration can operate with certainty.

It is a further object of the present invention to provide a semiconductor memory device which can check, in every output thereof, whether a spare memory cell is accessed.

In carrying out the above and other objects of the present invention in one form, there is provided an improved semiconductor memory device with a redundant configuration comprising a sense amplifier;

a roll call circuit which turns a first control signal to that of a first logical level when a read instruction or a write instruction is given within a normal level, turns the first control signal to that of a second logical level when the write instruction is given outside the normal level, and turns an output signal of said sense amplifier to a signal of the first logical level when a portion constituting the redundant configuration is accessed;

an output control circuit which, in the case of the first control signal being of the first logical level, receives the read instruction or the write instruction and then, turns a second control signal to that of the first logical level or that of the second logical level, and which, in the case of the first control signal being of the second logical level, turns the second control signal to that of the first logical level; and an output buffer circuit which takes the logical NOR of the second control signal of the output control circuit and an output signal of the sense amplifier, and outputs its result to an output terminal.

According to the present invention, the roll call circuit renders the output terminal to be of the first logical level when the write instruction within an usual voltage level is received, and renders the output terminal to be of the second logical level that is the high level of the ECL level when the write instruction outside the usual voltage level is received and the address of memory having a fault bit coincides with the selected address.

BRIEF DESCRIPTION OF THE DRAWINGS

The above objects, features and advantages of the present invention will be apparent from the following description of preferred embodiments according to the present invention explained with reference to the accompanying drawings, in which:

FIG. 2 is a block diagram showing a semiconductor memory device as a first embodiment according to the present invention;

PREFERRED EMBODIMENTS OF THE INVENTION

Throughout the following explanation, similar reference symbols or numerals refer to the same or similar elements in all figures of the drawings.

Firstly, for the purpose of assisting in the understanding of the present invention, a conventional method of detecting an address of a fault bit will first be described with reference to FIG. 1 before the present invention is explained.

Figure 1:
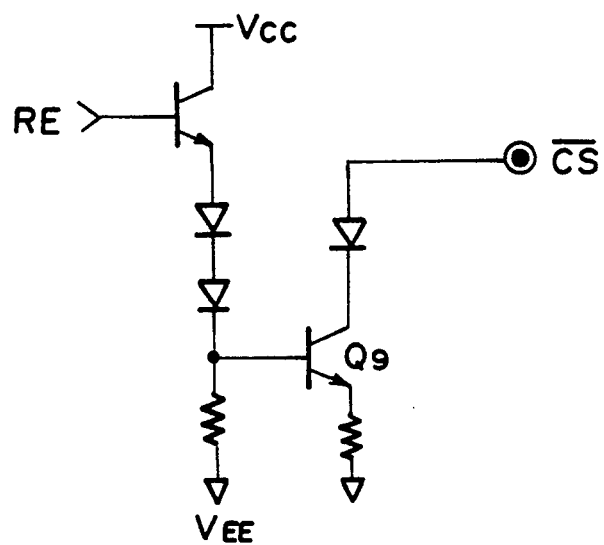
FIG. 1 is a circuit diagram of a typical and conventional circuit which detects an address of a fault bit.

The conventional method is of detecting the current of an input terminal as shown in FIG. 1. That is to say, $\overline{CS}$ (chip select) is selected as an input terminal and the level of the $\overline{CS}$ is lowered from the usual ECL level ("H" = −0.9 V, "L" = −1.7 V), for example, to −3 V. A bipolar transistor $Q_9$ is turned on/off according to the H/L of an ECL level at the signal RE generated by an address comparator. When the transistor $Q_9$ is turned on, a current of several μA flows from the $\overline{CS}$ terminal into a chip and the address of a fault bit can be detected.

The conventional semiconductor memory device mentioned above has a disadvantage in that, when a spare memory is accessed, since the amount of the power supply current increase is small, the measurement of the current is affected by the contact resistance between the $\overline{CS}$ terminal and the measuring device which measures the current of the terminal resulting in measurement errors, and also in that, in the case of a memory device having a plurality of outputs, the address of a fault bit cannot be detected in every output thereof.

Now, the embodiments of the present invention will be explained in detail hereinafter with reference to the appended drawings.

A semiconductor memory device according to the present invention has, as shown in FIG. 2, not only default cells but also spare cells which can be selected by word lines $SW_1$ and $SW_2$. Address buffers $2_1$ and $2_2$ input address signals to an X-decoder 3 and a sense amplifier 4, respectively. The data read out from the cell array 1 are outputted through an output buffer 5 to an output terminal $D_{OUT}$.

An address comparator 6 holds the address of a fault bit and, when the held address coincides with the address which is inputted by the address buffer $2_1$, causes a signal RE and a signal $RE_1$ or $RE_2$ to be active. Then, the spare memory cell is selected by the word lines $SW_1$ or $SW_2$. A R/W control circuit 7 controls read and write timing. An output control circuit 8 sets a logical level of a control signal OE on the basis of control signals $\overline{CS}$, $\overline{WE}$ and RCE. A roll call circuit 9 causes the control signal RCE to turn to "L" when the control signal $\overline{WE}$ is "H" or "L" in an ECL level, and causes it to turn to "H" when the control signal $\overline{WE}$ is "$V_{EE}$" level which is lower than the "L" in an ECL level. The roll call circuit 9, moreover, changes a control signal RCA to "H" when the signal $RE_1$ or $RE_2$ is in its active state, and changes it to its high impedance state when both the signals $RE_1$ and $RE_2$ are in their inactive state. The sense amplifier 4, which has a first sense amplifier 4a and a second sense amplifier 4b, outputs "L" when the control signal RCA is "H". The output buffer circuit 5 takes the logical NOR of the output of the sense amplifier 4 and the control signal OE, and outputs the result to the output terminal $D_{OUT}$.

Next, the operation of the embodiment according to the present invention will be explained hereinafter.

The mode determined by the logical levels of the signals $\overline{CS}$, $\overline{WE}$, $D_{IN}$, $D_{OUT}$ is shown in Table 1.

TABLE 1

| $\overline{CS}$ | $\overline{WE}$ | $D_{IN}$ | $D_{OUT}$ | Mode |
|---|---|---|---|---|
| H | X | X | L | Not Selected |
| L | L | L | L | Write 0 |
| L | L | H | L | Write 1 |

TABLE 1-continued

| $\overline{CS}$ | $\overline{WE}$ | $D_{IN}$ | $D_{OUT}$ | Mode |
|---|---|---|---|---|
| L | H | X | $D_{OUT}$ | Read |

In this table, "X" means arbitrary.

The power supply voltage "$V_{EE}$" is set to be −5.2 V and the levels of the signals $\overline{CS}$, $D_{IN}$ and $\overline{WE}$ are set to be "L", "L" and "$V_{EE}$", respectively. This state means a "write 0" state as shown in Table 1 because "$V_{EE}$" is of lower level than "L". Therefore, if the signal $\overline{WE}$ were "L" in an ECL level, the output terminal would become "L". But, since the signal $\overline{WE}$ is now "$V_{EE}$", the signal RCE is "H" and the signal OE is "L". When the address held by the address comparator 6 coincides with the address signal A, the signal RCA turns to "H" with the level of the output terminal $D_{OUT}$ being not "L" but "H", which means that the spare memory cell having been accessed is detected.

The operation of the roll call circuit 9 will be described hereinafter in detail based on FIG. 3.

When the signal $\overline{WE}$ is H/L in an ECL level, both a bipolar transistor $Q_1$ and an nMOS transistor $M_2$ turn on. The signal RCE becomes −1.6 V and the signal RCA is determined by the level of the output RB from the first sense amplifier 4a.

Since the output control circuit is an ECL gate and the signal RCE is −1.6 V now, the output of this circuit is determined by the signals $\overline{WE}$ and $\overline{CS}$. That is to say, when the signal $\overline{WE}$ is H/L in an ECL level, the circuit conducts its usual operation (for example, read and write).

Next, hereinafter will be explained the operation of the roll call circuit under the state in which writting 0 takes place and in which the signal $\overline{WE}$ is leveled down to "$V_{EE}$".

Figure 3:
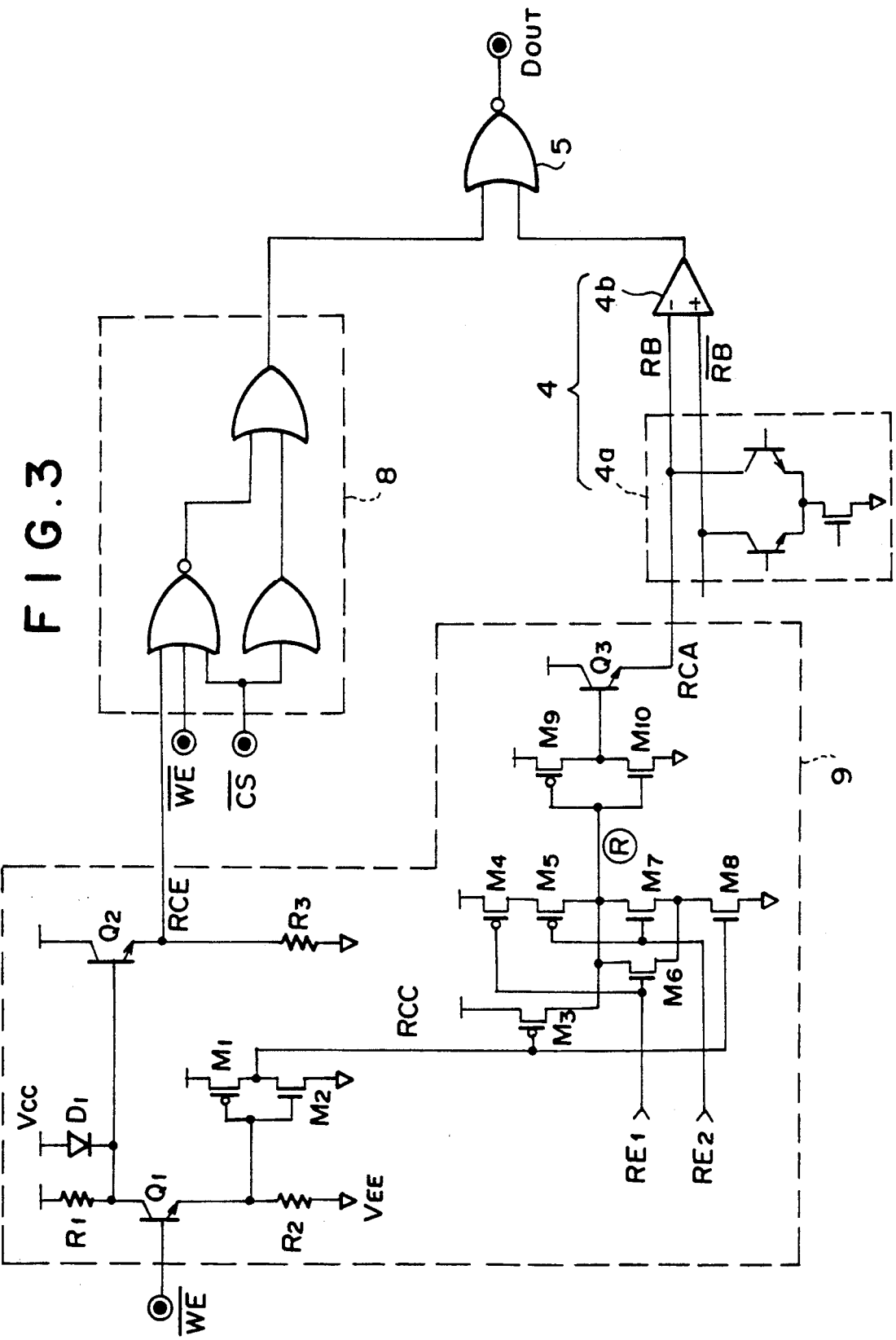
FIG. 3 is a detailed circuit diagram of a roll call circuit and its related circuit which are included in the semiconductor memory device of the first embodiment shown in FIG. 2.

The bipolar transistor $Q_1$ and the nMOS transistor $M_2$ shown in FIG. 3 turn off and the signal RCE becomes −0.8 V and the signal RCA becomes −0.9 V (approximately). As a result, the output $\overline{OE}$ of the output control circuit 8 becomes −1.7 V so that the output level of $D_{OUT}$ is determined by the output of the sense amplifier 4.

Figure 4:
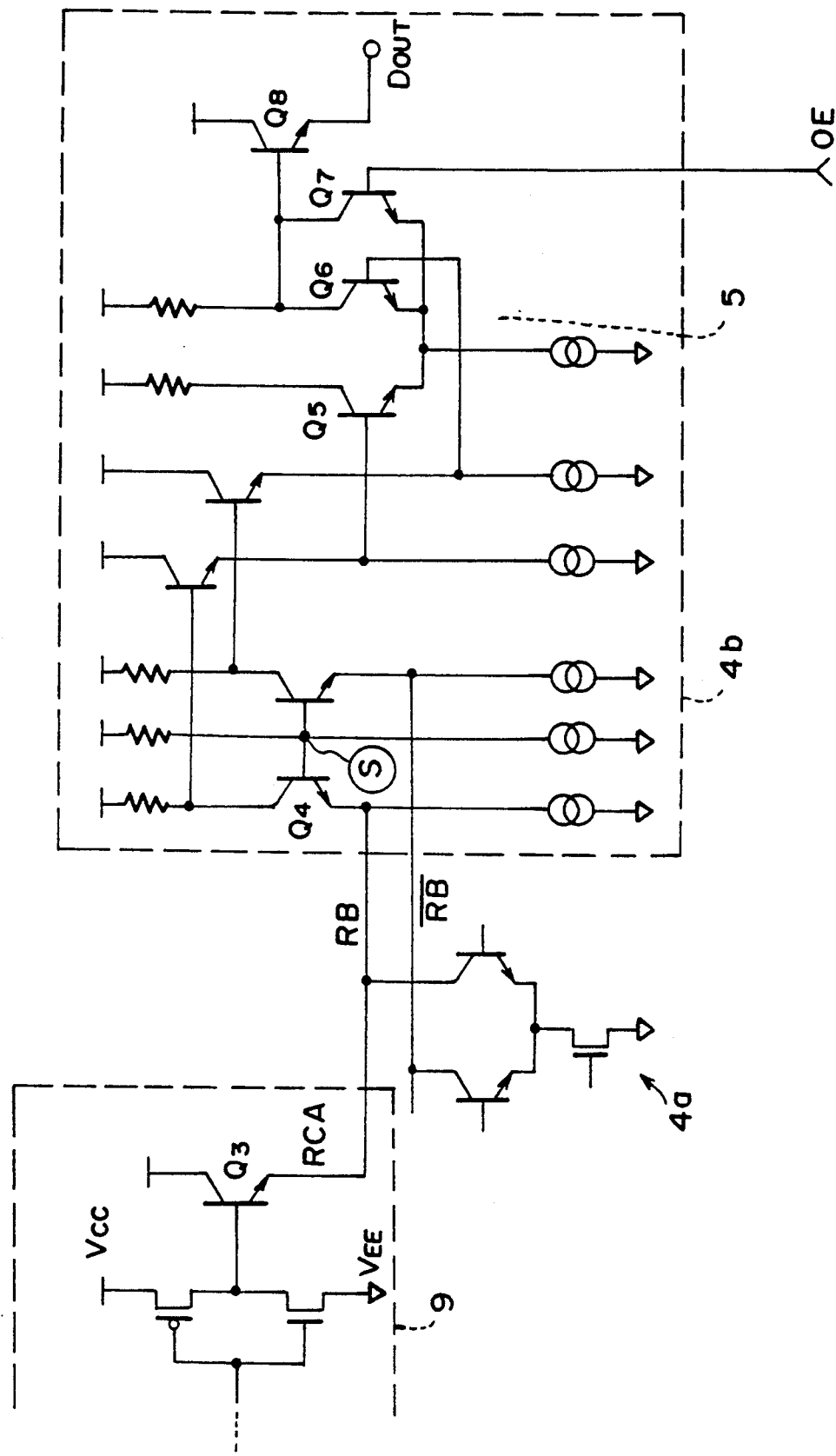
FIG. 4 is a detailed circuit diagram of a second sense amplifier included in the circuit shown in FIG. 3.

As for the signal of the sense amplifier, as shown in FIG. 4, the S-point in the second sense amplifier 4b is about −0.5 V, and a base potential of a bipolar transistor $Q_3$ which outputs the signal RCA is about −0.1 V. As a result, a bipolar transistor $Q_4$ turns off and a bipolar transistor $Q_5$, which is one of the bipolar transistors $Q_5$ and $Q_6$ constituting a current switch of the output buffer 5, turns on. This results in the output $D_{OUT}$="H". As for the signals $RE_1$, $RE_2$ from the address comparator 6 in FIG. 2, the signal $RE_1$, for example, becomes "$V_{CC}$" if a spare memory row $SW_1$ is used. Because of the signal $\overline{WE}$="$V_{EE}$" and the signal RCC="$V_{CC}$", the R-point of the roll call circuit 9 shown in FIG. 3 outputs $RE_1+RE_2$. Therefore, as mentioned above, when the address having a fault bit coincides with the selected address, the signal RCA becomes −0.9 V. When the roll call circuit 9 operates with $\overline{WE}$="$V_{EE}$" and the address having a fault bit does not coincide with the selected address, both the signals $RE_1$ and $RE_2$ become "$V_{EE}$" and the bipolar transistor $Q_3$ turns off, so that the signal RCA is determined by an output RB of the first sense amplifier 4a. Since the present mode is of "writing 0", the first sense amplifier 4a outputs the same level signal as that at the time of "reading 0". This results in $D_{OUT}=$"L".

In a semiconductor memory device with a redundant configuration according to the present invention, in summary, a roll call circuit 9 turns a first control signal RCE to that of a first logical level (for example, "L" level) when a read instruction or a write instruction is given within a normal level ("H" or "L" level), turns the first control signal RCE to that of a second logical level ("H" level) when said write instruction is given outside said normal level (for example, $V_{EE}=-5.2$ V), and turns, by means of a control signal RCA, an output signal of a sense amplifier 4 to a signal of the first logical level ("L" level) when a portion constituting the redundant configuration is accessed;

an output control circuit 8, in the case of the first control signal RCE being of the first logical level ("L" level), receives the read instruction or the write instruction and then, turns a second control signal OE to that of the first logical level ("L" level) or that of the second logical level ("H" level), and, in the case of said first control signal RCE being of the second logical level ("H" level), turns the second control signal OE to that of said first logical level, ("L" level); and an output buffer circuit 5 takes the logical NOR of the second control signal OE of the output control circuit 8 and an output signal of the sense amplifier 4, and outputs its result to an output terminal $D_{OUT}$.

Figure 5:
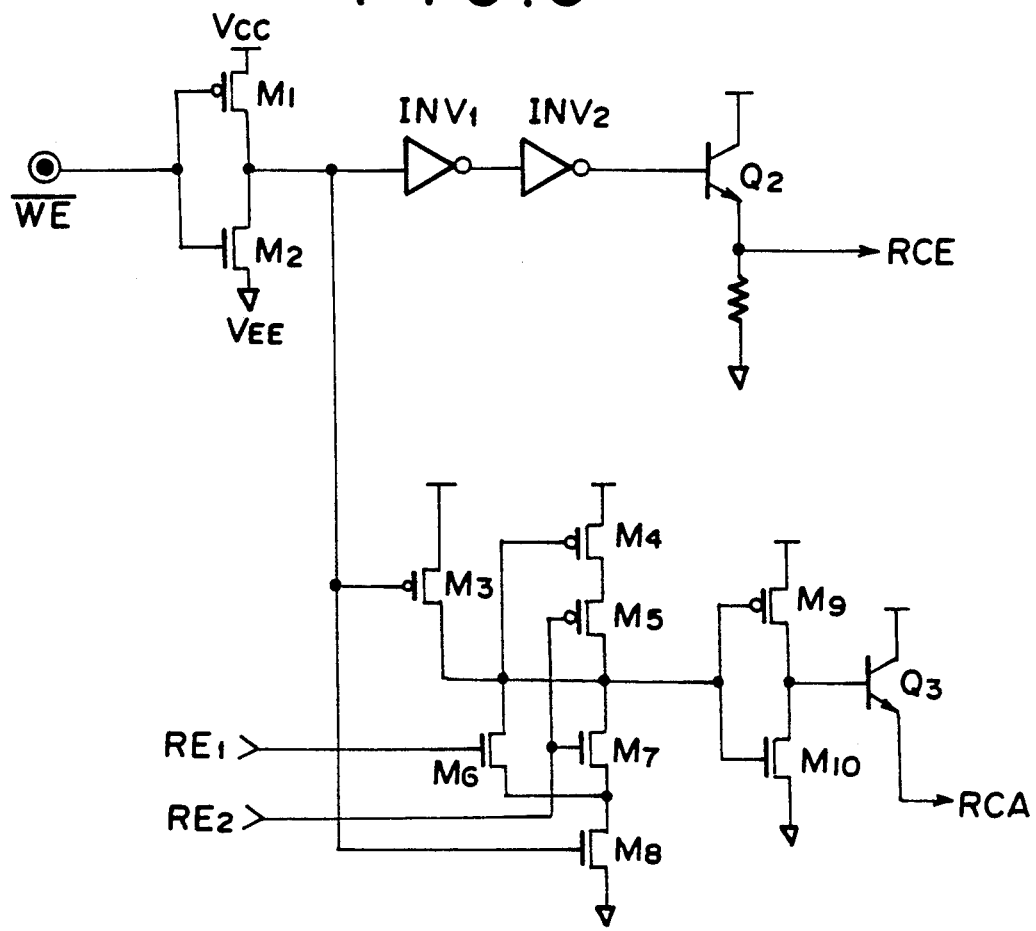
FIG. 5 is a detailed circuit diagram of a roll call circuit as a second embodiment according to the present invention.

FIG. 5 shows a circuit diagram of a roll call circuit as a second embodiment according to the present invention. The condition and the decision process for operation of this roll call circuit are the same as those of the first embodiment. An advantage in the second embodiment resides in a simpler circuit configuration as compared with the first embodiment shown in FIG. 3.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A semiconductor memory device with a redundant configuration wherein a spare memory cell is provided in addition to a normal memory cell, said semiconductor memory device comprising:

a roll call circuit for outputting a first control signal of a first ECL level when a level of one of a read instruction signal and a write instruction signal is within a predetermined range, and wherein said first control signal is output at a second ECL level when said level of said write instruction signal is outside of the predetermined range, said roll call circuit further generating a second control signal of a second ECL level when said spare memory cell is selected;

a sense amplifier responsive to said second control signal from said roll call circuit for outputting an output signal of a second ECL level when said second control signal received from said roll call circuit is at a second ECL level indicating that said spare memory cell is accessed;

an output control circuit responsive to said first control signal from said roll call circuit for outputting a third control signal of one of the first ECL level and the second ECL level upon receipt of one of said read instruction signal and said write instruction signal when said first control signal received from said roll call circuit is at the first ECL level, and wherein said output control circuit outputs the third control signal of the first ECL level when said first control signal received from said roll call circuit is at the second ECL level; and an output buffer circuit for performing a logical NOR operation of said third control signal received from said output control circuit and said output signal received from said sense amplifier, and for generating a detection signal having the second ECL level which is supplied to an output terminal indicating that the spare memory cell is in use.

2. A semiconductor memory device with a redundant configuration according to claim 1, in which said first ECL level is a low level and said second ECL level is a high level.

* * * * *

UNITED STATES PATENT AND TRADEMARK OFFICE
CERTIFICATE OF CORRECTION

PATENT NO. : 5,267,205
DATED : Nov. 30, 1993
INVENTOR(S) : Mitsuhiro HAMADA

It is certified that error appears in the above-indentified patent and that said Letters Patent is hereby corrected as shown below:

Col. 4, line 35, delete "writting" and insert --writing--.

Col. 4, line 59, delete " $RE_1 + RE_2$ " and insert -- $\overline{RE_1 + RE_2}$ --.

Signed and Sealed this

Tenth Day of January, 1995

Attest:

BRUCE LEHMAN

*Attesting Officer*     *Commissioner of Patents and Trademarks*